(12) United States Patent
Huang

(10) Patent No.: US 7,653,354 B2
(45) Date of Patent: Jan. 26, 2010

(54) TRANSMITTER IC WITH SAW-BASED OSCILLATOR

(75) Inventor: Ching-Hsing Huang, Hsinchu (TW)

(73) Assignee: Princeton Technology Corporation, Taipei County (TW)

( * ) Notice: Subject to any disclaimer, the term of this patent is extended or adjusted under 35 U.S.C. 154(b) by 341 days.

(21) Appl. No.: 11/797,610

(22) Filed: May 4, 2007

(65) Prior Publication Data

US 2008/0090530 A1 Apr. 17, 2008

(30) Foreign Application Priority Data

Oct. 14, 2006 (TW) .............................. 95137898 A

(51) Int. Cl.
*H04B 7/00* (2006.01)
*H04B 1/16* (2006.01)

(52) U.S. Cl. ...................... 455/41.2; 455/41.3; 455/334

(58) Field of Classification Search ................ 455/41.2, 455/41.3, 147, 208, 130, 134, 161.1, 91, 455/39, 161.3, 226.2; 331/158, 116 FE
See application file for complete search history.

(56) References Cited

U.S. PATENT DOCUMENTS

| | | | | |
|---|---|---|---|---|
| 5,978,664 A | * | 11/1999 | Janssen | .................... 455/226.2 |
| 7,183,868 B1 | * | 2/2007 | Wessendorf | ................. 331/158 |
| 7,327,806 B2 | * | 2/2008 | Liem et al. | ................... 375/322 |
| 2008/0090543 A1 | * | 4/2008 | Huang | ........................ 455/333 |
| 2009/0058546 A1 | * | 3/2009 | Yajima | ................. 331/116 FE |

* cited by examiner

*Primary Examiner*—Sonny Trinh
(74) *Attorney, Agent, or Firm*—Muncy, Geissler, Olds & Lowe, PLLC

(57) ABSTRACT

A transmitter IC provided with a SAW-based oscillator with an external SAW device. The transmitter IC comprises an oscillating circuit. The oscillating circuit comprises an inverter stage, a first capacitor, a second capacitor, and a resistor. The inverter stage has input and output terminals respectively coupled to two ends of the external SAW device. The first and second capacitors are respectively coupled between the input/output terminal and a ground. The resistor is coupled between the input and output terminals of the inverter stage.

12 Claims, 4 Drawing Sheets

TRANSMITTER IC WITH SAW-BASED OSCILLATOR

BACKGROUND OF THE INVENTION

1. Field of the Invention

The invention relates to a transmitter and, in particular, to a transmitter IC with a SAW-based oscillator.

2. Description of the Related Art

In wireless communication, radio frequency integrated circuits (RFICs) are used in keyless entry systems, wireless mice, remote control systems, alarm systems, security systems, and the like. A transmitter is an indispensable element in an RFIC.

BRIEF SUMMARY OF THE INVENTION

An embodiment of a transmitter IC associated with an external SAW device comprises an oscillating circuit. The oscillating circuit comprises an inverter stage, a first capacitor, a second capacitor, and a resistor. The inverter stage has input and output terminals respectively coupled to two ends of the external SAW device. The first and second capacitors are respectively coupled between the input/output terminal and a ground. The resistor is coupled between the input and output terminals of the inverter stage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
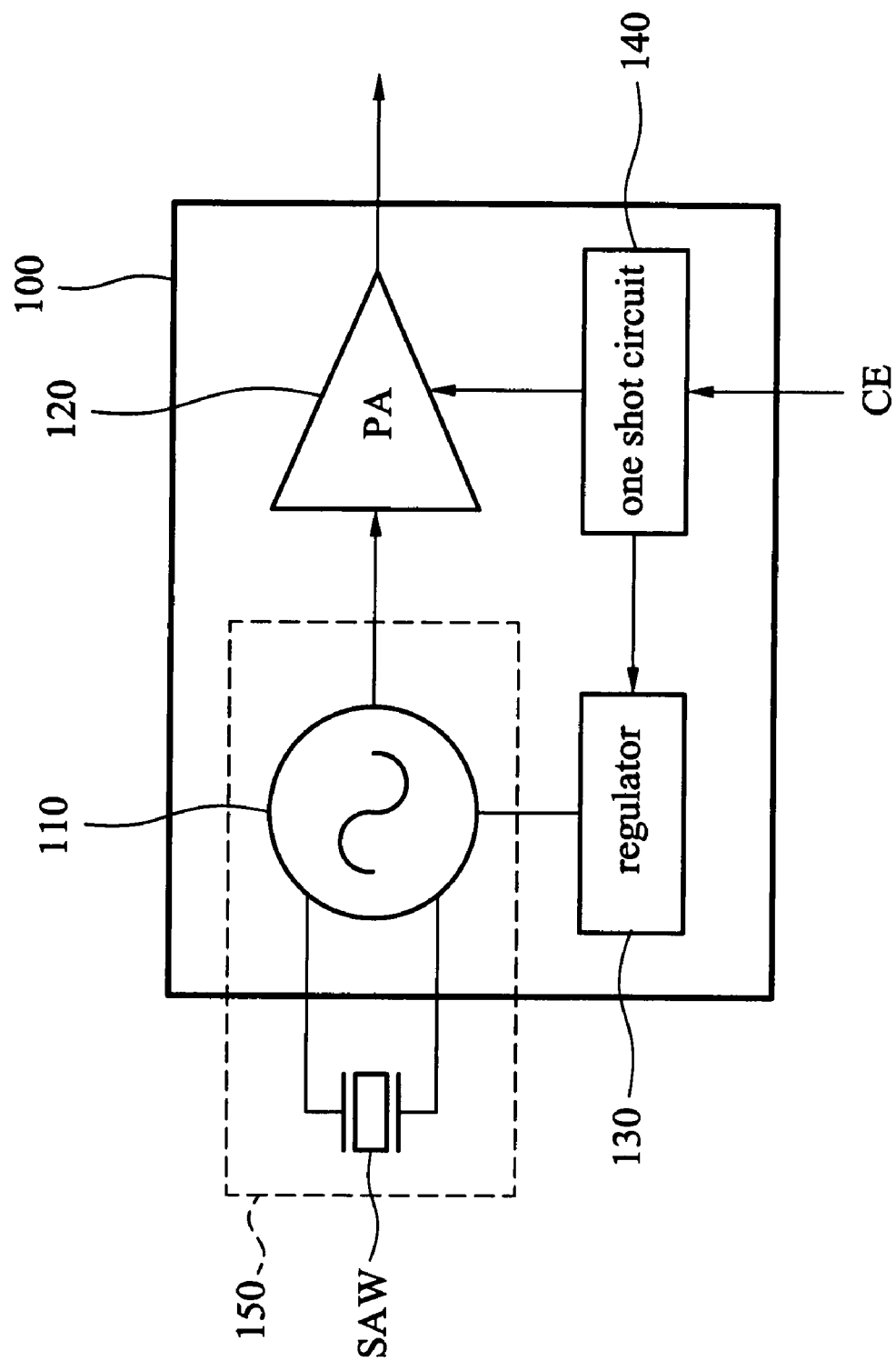
FIG. 1 is a block diagram of a transmitter IC with a SAW-based oscillator according to an embodiment of the invention.

FIG. 1 is a block diagram of a transmitter IC with a SAW-based oscillator according to an embodiment of the invention. The transmitter IC 100 comprises an oscillating circuit 110, a power amplifier 120, a regulator 130, and a one shot circuit 140. A SAW-based oscillator 150 is obtained by coupling the oscillating circuit 110 to an external SAW device. The regulator 130 is coupled between the oscillating circuit 110 and the one shot circuit 140. The power amplifier 120 is also coupled between the oscillating circuit and the one shot circuit.

The one shot circuit 140 is coupled to a chip enable pin CE to receive an enable signal controlling operation of the transmitter IC 100 and data to be transmitted thereby. The data received by the chip enable pin CE is transmitted to a power amplifier 120 and then transmitted thereby. When the data received by the enable pin CE does not change and maintains a specific voltage level for a specific time, the one shot circuit 140 transmits a control signal to the regulator 130 such that the regulator 130 suspends. Meanwhile, since the oscillating circuit 110 cannot get electrical energy from the regulator 130, the oscillating circuit 110 also suspends temporarily. As a result, power loss due to the transmitter IC 100 is eliminated. When the chip enable pin CE receives the data to be transmitted again, the control signal provided by the one shot circuit enables the regulator 130 and the oscillating circuit 110 is thus enabled.

Figure 2:
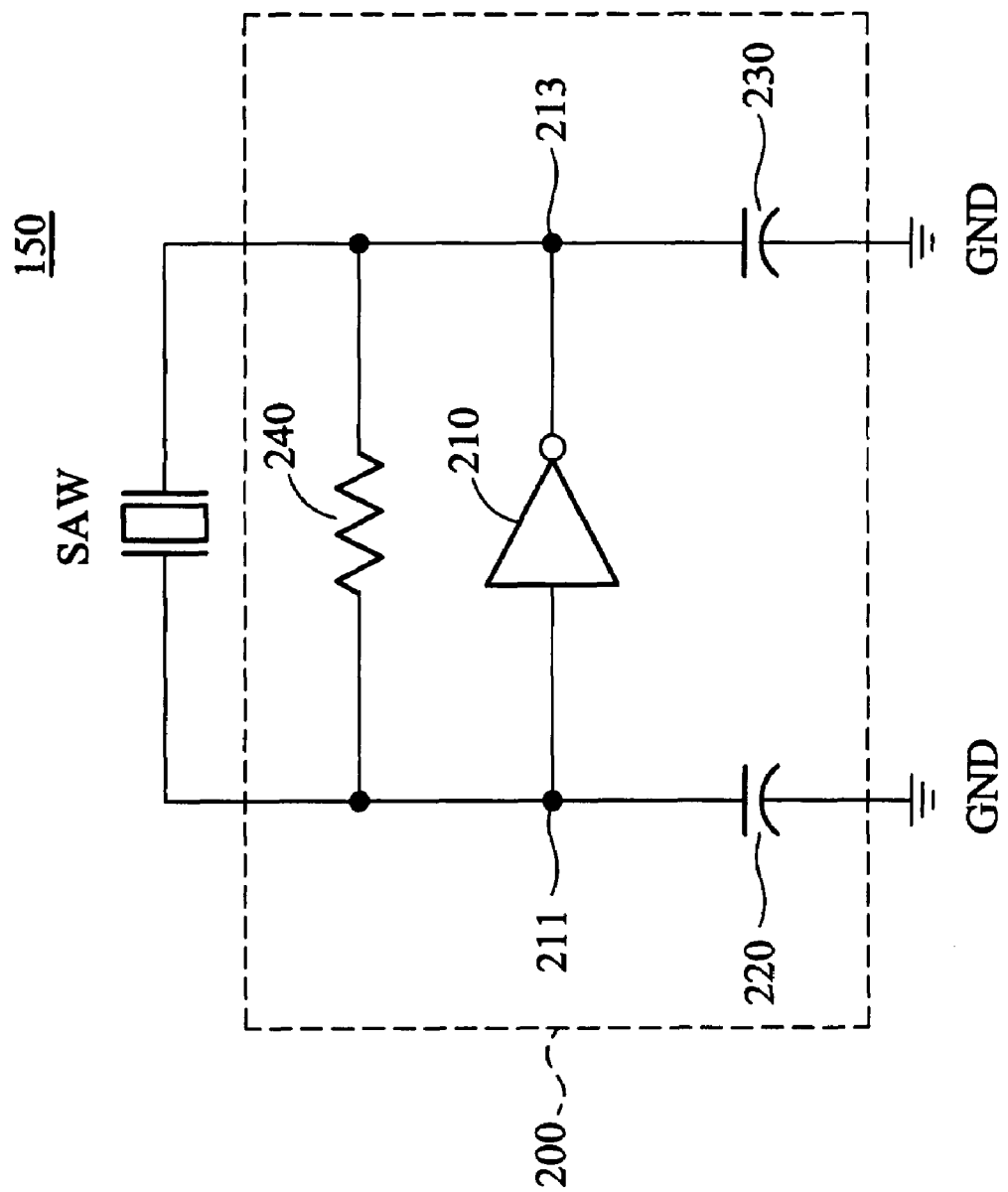
FIG. 2 is a circuit diagram of the SAW-based oscillator 150 in FIG. 1.

FIG. 2 is a circuit diagram of the SAW-based oscillator 150 in FIG. 1. The SAW-based oscillator 150 comprises an oscillating circuit 200. The oscillating circuit 200 comprises an inverter stage 210, first and second capacitors 220 and 230, and a resistor 240. The inverter stage 210 has an input terminal 211 and an output terminal 213 respectively coupled to one and the other ends of a SAW device 300. In the embodiment, the SAW device is a SAW resonator. The first capacitor 220 is coupled between the input terminal 211 of the inverter stage 210 and a ground GND and the second capacitor 230 coupled between the output terminal 213 of the inverter stage 210 and the ground GND. The resistor 240 is coupled between the input terminal 211 and the output terminal 213 of the inverter stage 210. An output signal at the output terminal 213 is an inverse of an input signal at the input terminal 211. Preferably, the inverter stage 210 comprises three inverters connected in series. However, the number of inverters is not limited thereto and more than three can be applied in the inverter stage 210 in a transmitter IC with a SAW-based oscillator according to the invention.

Figure 3A:
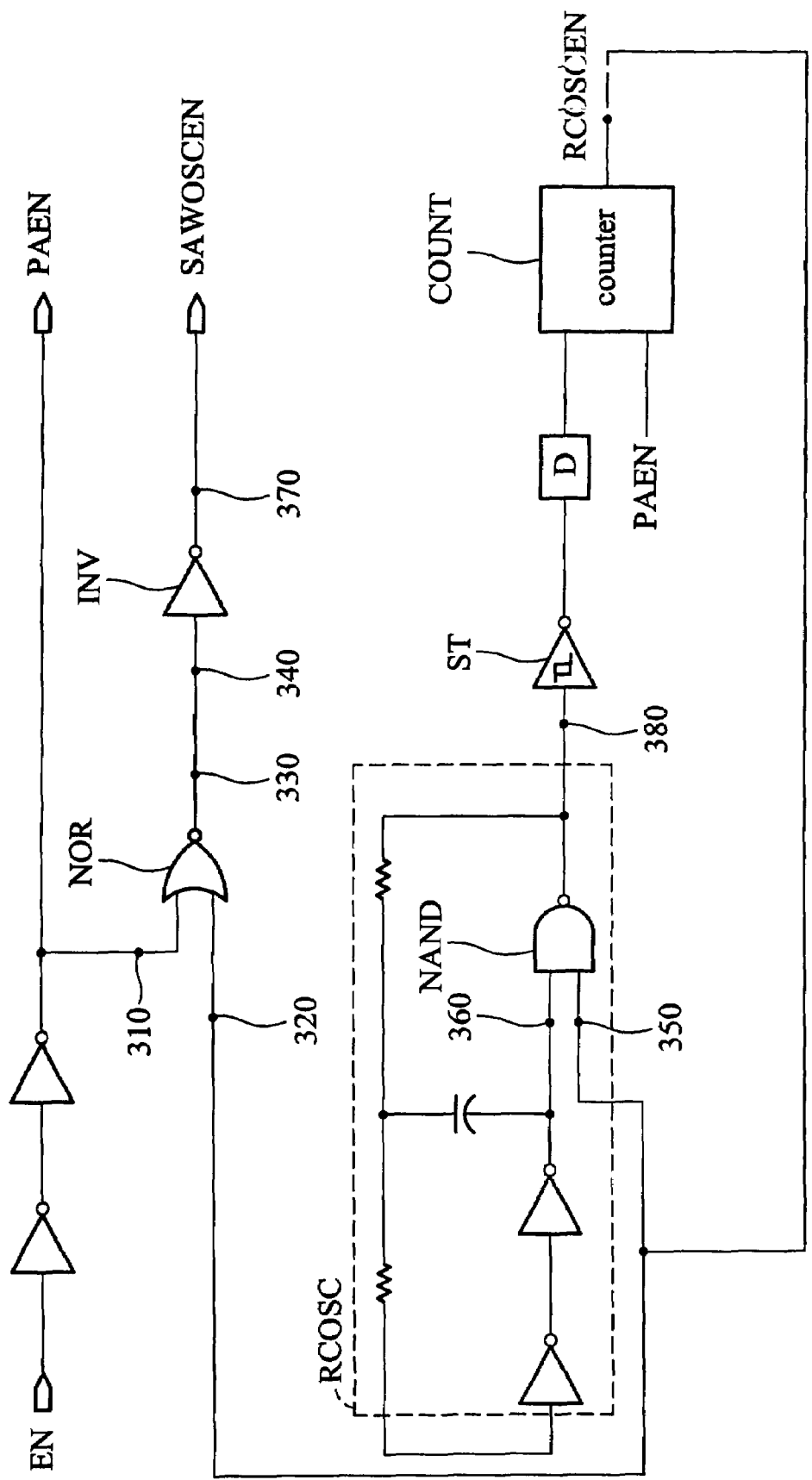
FIG. 3A is a circuit diagram of the one shot circuit in FIG. 1.

FIG. 3A is a circuit diagram of the one shot circuit in FIG. 1. The one shot circuit is a simple logic circuit and comprises a NOR gate, an inverter INV, a delay device, a delay device D, a RC oscillator RCOSC, a Schmitt trigger ST and a counter CONT, wherein the RC oscillator RCOSC comprises a NAND gate NAND. A first input terminal 310 of the NOR gate NOR is coupled to the chip enable pin CE and receives an enable signal EN. A first input terminal 350 of the NAND gate NAND is coupled to a second input terminal 320 of the NOR gate NOR. The delay device D is coupled to an output terminal 380 of the RC oscillator RCOSC via the Schmitt trigger ST. The counter COUNT is coupled between the delay device D and the first input terminal 350 of the NAND gate NAND along with the second input terminal 320 of the NOR gate NOR and receives a power amplifier enable signal PAEN in phase with the enable signal EN. The counter COUNT calculates the time period in which the signal received by the chip enable pin CE does not switch and maintains a specific voltage level. The input terminal 340 of the inverter INV is coupled to the output terminal 330 of the NOR gate NOR. The output terminal 370 provides a control signal SAWOSCEN to the SAW-based oscillator 150.

Figure 3B:
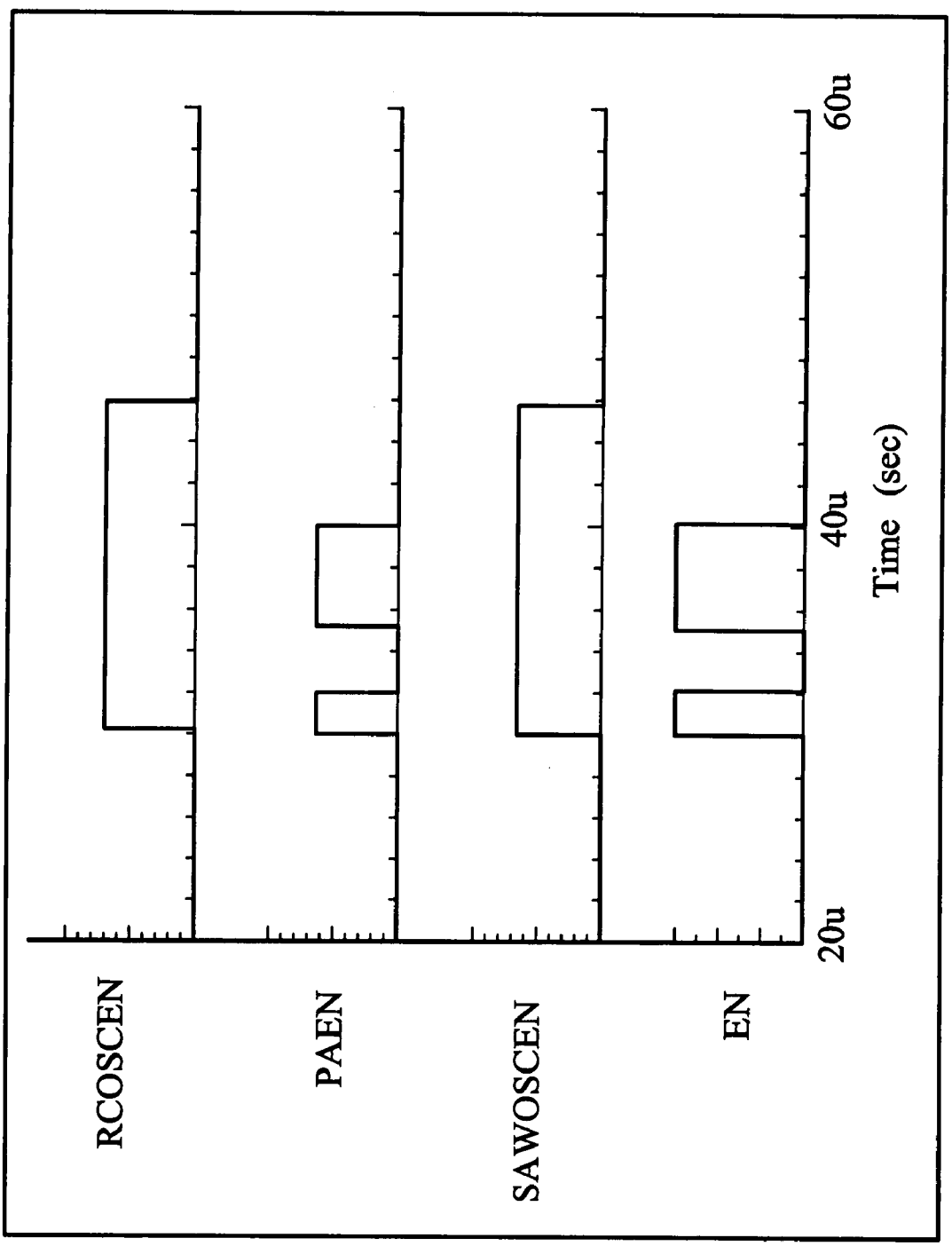
FIG. 3B is a schematic diagram showing waveforms of the signals of the one shot circuit 140 in FIG. 3A.

FIG. 3B is a schematic diagram showing waveforms of the signals of the one shot circuit 140 in FIG. 3A. As shown in FIG. 3B, if voltage level of the enable signal EN is 1, voltage level of the power amplifier enable signal is 1 and the RC oscillator control signal RCOSCEN generated by the counter COUNT is also 1. In this case, the RC oscillator keeps oscillating. If voltage level of the enable signal EN is 0, voltage level of the power amplifier enable signal is 0 and the counter starts counting. When voltage level of the RC oscillating control signal RCOSCEN is maintained at 1 for a specific time, the RC oscillator control signal RCOSCEN generated by the counter COUNT switches to 0. Correspondingly, voltage level of the control signal SAWOSCEN also switches to 0. In this case, the RC oscillator stops oscillating temporarily such that power loss due to the transmitter IC is eliminated.

When the chip enable pin CE receives the data to be transmitted again, the control signal provided by the one shot circuit enables the regulator and the oscillating circuit is thus enabled. It is noted that the one shot circuit 140 is not limited to this structure. Those skilled in the art can implement an one shot circuit with other logic gates and delay devices.

In conventional technologies, two pins are required to receive an enable signal and data to be transmitted by the transmitter IC 100. In the invention, the chip enable pin CE only requires a single pin to receive an enable signal for controlling operation of the transmitter IC and data to be transmitted by the transmitter IC 100 such that pin count and circuit area is reduced.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A transmitter IC associated with an external SAW device, comprising:
    an oscillating circuit, comprising:
        an inverter stage having an input terminal and an output terminal respectively coupled to one and the other ends of the external SAW device;
        a first capacitor coupled between the input terminal of the inverter stage and a ground;
        a second capacitor coupled between the output terminal of the inverter stage and the ground; and
        a resistor coupled between the input and output terminals of the inverter stage;
    a chip enable (CE) pin receiving an enable signal for controlling the transmitter IC and data to be transmitted; and
    a one shot circuit coupled to the CE pin and the oscillating circuit, wherein the one shot circuit stops operation of the oscillating circuit when the enable signal maintains a predetermined voltage level for a specific time.

2. The transmitter IC as claimed in claim 1, further comprising a power amplifier and a regulator coupled between the oscillating circuit and the one shot circuit.

3. The transmitter IC as claimed in claim 1, wherein the one shot circuit comprises a NOR gate having first and second terminals, an inverter having an input terminal coupled to an output terminal of the NOR gate, and a delay device coupled to the second input terminal of the NOR gate, wherein the first terminal of the NOR gate is coupled to the CE pin.

4. The transmitter IC as claimed in claim 3, the one shot circuit further comprises a RC oscillator coupled to the second input terminal of the NOR gate, and a counter coupled between the delay device along with the RC oscillator and the second input terminal of the NOR gate.

5. The transmitter IC as claimed in claim 4, wherein the RC oscillator comprises a NAND gate having first and second input terminals and an output terminal, wherein the first input terminal is coupled to the second input terminal of the NOR gate and the second input terminal is coupled to the output terminal.

6. The transmitter IC as claimed in claim 5, wherein the one shot circuit further comprises a Schmitt trigger coupled between the delay device and the output terminal of the NAND gate.

7. A transmitter IC associated with an external SAW device, comprising:
    an oscillating circuit, comprising:
        an inverter stage having an input terminal and an output terminal respectively coupled to one and the other ends of the external SAW device;
        a first capacitor coupled between the input terminal of the inverter stage and a ground;
        a second capacitor coupled between the output terminal of the inverter stage and the ground; and
        a resistor coupled between the input and output terminals of the inverter stage; and
    a one shot circuit, coupled to the oscillating circuit, wherein the one shot circuit stops operation of the oscillating circuit when the enable signal maintains a predetermined voltage level for a specific time;
    a power amplifier, coupled between the oscillating circuit and the one shot circuit; and
    a regulator, coupled between the oscillating circuit and the one shot circuit.

8. The transmitter IC as claimed in claim 7, wherein the inverter stage comprises three inverters connected in series.

9. The transmitter IC as claimed in claim 7, further comprising a chip enable (CE) pin coupled to the one shot circuit, receiving an enable signal for controlling the transmitter IC and data to be transmitted.

10. The transmitter IC as claimed in claim 7, wherein the one shot circuit comprises a NOR gate having first and second terminals, an inverter having an input terminal coupled to an output terminal of the NOR gate, and a delay device coupled to the second input terminal of the NOR gate, wherein the first terminal of the NOR gate is coupled to the CE pin.

11. The transmitter IC as claimed in claim 10, wherein the RC oscillator comprises a NAND gate having first and second input terminals and an output terminal, wherein the first input terminal is coupled to the second input terminal of the NOR gate and the second input terminal is coupled to the output terminal.

12. The transmitter IC as claimed in claim 11, wherein the one shot circuit further comprises a Schmitt trigger coupled between the delay device and the output terminal of the NAND gate.

* * * * *